United States Patent
Chen et al.

(10) Patent No.: US 6,177,204 B1
(45) Date of Patent: *Jan. 23, 2001

(54) FERROMAGNETIC GMR MATERIAL AND METHOD OF FORMING AND USING

(75) Inventors: Eugene Chen, Gilbert; Saied N. Tehrani, Tempe, both of AZ (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/932,400

(22) Filed: Sep. 17, 1997

Related U.S. Application Data

(62) Division of application No. 08/553,933, filed on Nov. 6, 1995, now Pat. No. 5,702,831.

(51) Int. Cl.[7] .................................................. G11B 5/66
(52) U.S. Cl. .................. 428/611; 428/63 J; 428/668; 428/678; 428/680; 428/681; 428/675; 428/676; 428/667; 428/652; 428/694 R; 428/694 TM; 428/900; 360/113; 360/126; 324/252; 338/32 R; 427/128; 427/129; 427/130
(58) Field of Search ................................ 428/611, 635, 428/668, 678, 680, 681, 675, 676, 667, 692, 906, 634 R, 634 TM; 360/113, 126; 324/252; 338/32 R; 427/128–130

(56) References Cited

U.S. PATENT DOCUMENTS

| 4,780,848 | 10/1988 | Daughton et al. ................ 365/173 |
| 5,301,079 | 4/1994 | Cain et al. ........................ 360/324 |
| 5,343,422 | 8/1994 | Kung et al. ...................... 365/173 |
| 5,408,377 | 4/1995 | Gurney et al. ................... 360/325 |
| 5,442,508 | 8/1995 | Smith ............................... 360/314 |
| 5,585,986 | 12/1996 | Parkin ............................. 360/324 |
| 5,587,943 | 12/1996 | Torok et al. ..................... 365/158 |
| 5,617,071 | 4/1997 | Daughton ....................... 338/32 R |
| 5,702,831 | * 12/1997 | Chen ................................. 428/611 |

FOREIGN PATENT DOCUMENTS

| 0624868 | 11/1994 | (EP) . |
| 9309541 | 5/1993 | (WO) . |

* cited by examiner

*Primary Examiner*—Leszek Kiliman
(74) *Attorney, Agent, or Firm*—William E. Koch

(57) ABSTRACT

A multi-layer magnetic material (10) has magnetic vectors (21,22) that point along a length (27) of the material (10). Opposing magnetic fields cause the vectors to snap past the perpendicular position with a rapid change in the resistance of the material. The material is used as a memory cell (37,38,39,41) of a memory (36).

9 Claims, 3 Drawing Sheets

FERROMAGNETIC GMR MATERIAL AND METHOD OF FORMING AND USING

This is a division of application Ser. No. 08/553,933, filed Nov. 6, 1995, now U.S. Pat. No. 5,702,831.

BACKGROUND OF THE INVENTION

The present invention relates, in general to magnetic materials, and more particularly, to a novel magnetoresistive material.

In the past, a variety of magnetic materials and structures have been utilized to form magnetoresistive materials for non-volatile memory elements, read/write heads for disk drives, and other magnetic type applications. One prior magnetoresistive element utilized a magnetoresistive material that has two magnetic layers separated by a conductor layer. The magnetization vectors of the two magnetic layers typically are anti-parallel to each other in the absence of any magnetic fields. The magnetization vectors of one of the layers points in one direction and the magnetization vector of the other layer always points in the opposite direction. The magnetic characteristics of such magnetic materials typically require a width greater than one micron in order to maintain the orientation of the magnetization vectors along the width of the cell. The large width requirement limits the density of memories utilizing such materials. Additionally, reading the state of such memories typically requires a two-phase read operation that results in very long read cycles. The two phase read operation also requires extra circuitry to determine the state of the memory, thus increasing the cost of such memories. An example of such a magnetic material and memory is disclosed in U.S. Pat. No. 4,780,848 issued to Daughton et al. on Oct. 25, 1988.

Another prior material uses multi-layer giant magnetoresistive materials (GMR) and utilizes submicron widths, in order to increase density. In this structure the magnetization vectors are parallel to the length of the magnetic material instead of the width. The magnetization vector of one magnetic material layer is always maintained in one direction while the magnetization vector of the second magnetic layer switches between parallel and antiparallel to the first vector in order to represent both logical "0" and "1" states. In order to determine the logical state of a memory cell utilizing this material, the memory cell has a reference cell and an active cell. The reference cell always provides a voltage corresponding to one state (either always a "1" or always a "0"). The output of the reference cell is compared to the output of the active cell in order to determine the state of the memory cell. The requirement for an active and a reference cell reduces the density of a memory that utilizes such elements. Additionally, each memory cell requires transistors to switch the active and reference cells at appropriate times in order to read the cells. This further increases the cost of the memory.

Accordingly, it is desirable to have a GMR material that has a submicron width, that does not require multiple read operations to determine the logical state of the memory cell, that results in a high density memory array, and that reduces the cost of a memory utilizing the material.

DETAILED DESCRIPTION OF THE DRAWINGS

Figure 1:
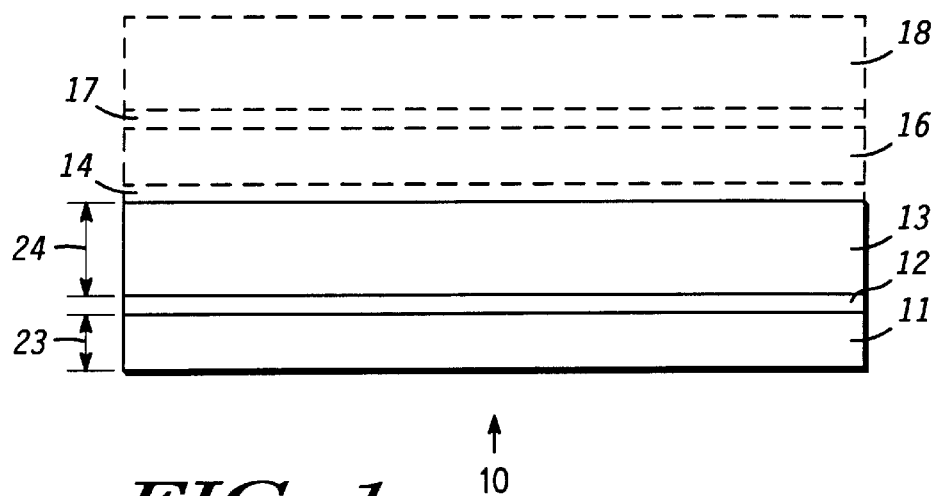
FIG. 1 illustrates an enlarged cross-sectional view of a GMR material according to the present invention.

FIG. 1 illustrates an enlarged cross-sectional view of a giant magnetoresistive GMR material 10 having multiple layers that are ferromagnetically coupled. Material 10 includes a plurality of magnetic layers including a first magnetic layer 11 and a second magnetic layer 13. Layers 11 and 13 are separated by a first conductive spacer layer 12. Magnetic layers 11 and 13 each can be single layers of magnetic materials such as a layer of nickel or iron or cobalt or alloys thereof including alloys having palladium or platinum. Any of layers 11 and 13 alternately can be a composite magnetic layer, such as a layer of nickel-iron-cobalt covering a layer of cobalt-iron or three layer structures including layers of cobalt-iron and nickel-iron-cobalt and cobalt-iron with cobalt-iron at the interface with adjacent layers. Materials that are suitable for layer 12 includes most conductive materials including copper, copper alloys, chromium, and chromium alloys. Additionally, layer 11 has a first thickness or thickness 23 and layer 13 has a second thickness or thickness 24 that is greater than thickness 23. The different thicknesses are explained hereinafter in the discussion of FIGS. 2 and 3.

Although shown having two magnetic layers, material 10 can have more than two magnetic layers including a third magnetic layer 16, and a fourth magnetic layer 18 that typically are similar to layers 11 and 13 but may have different thicknesses, and separated by a second conductive spacer layer 14 and a third conductive spacer layer 17 that are similar to layer 12. For sake of simplicity of the following explanations, layers 14, 16, 17, and 18 are omitted and consequently are shown in phantom.

Figure 2:
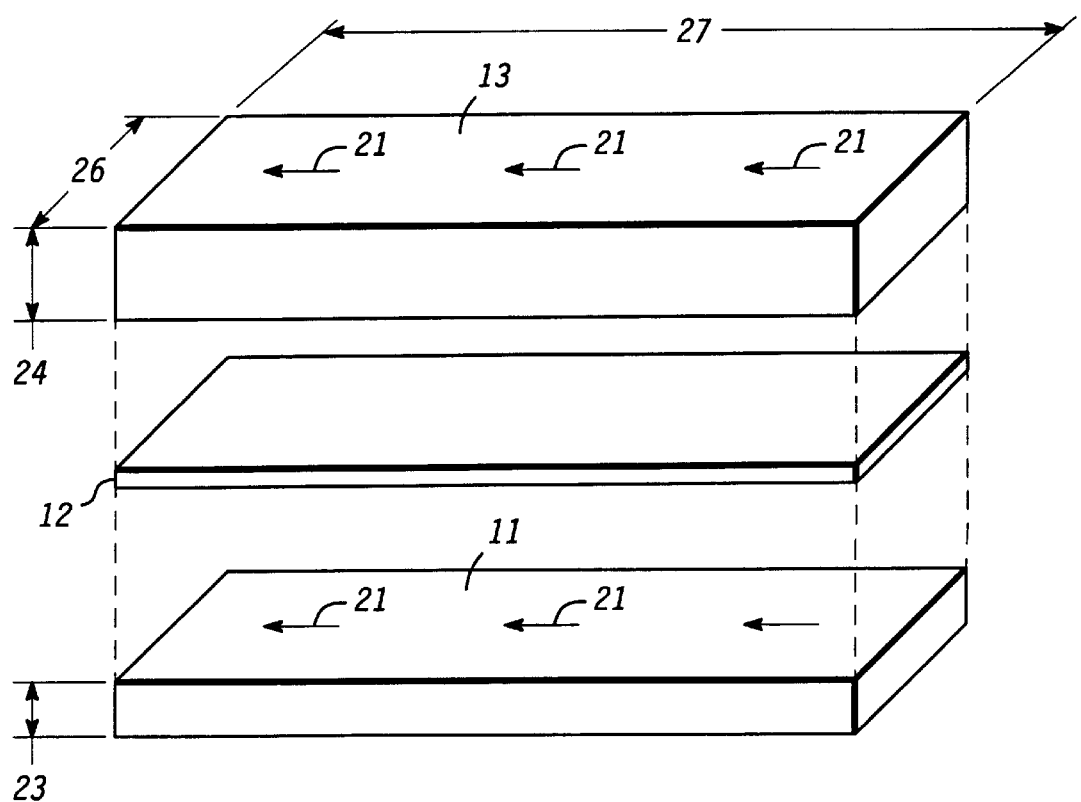
FIG. 2 illustrates an enlarged exploded view of the GMR material shown in FIG. 1 according to the present invention.
Figure 3:
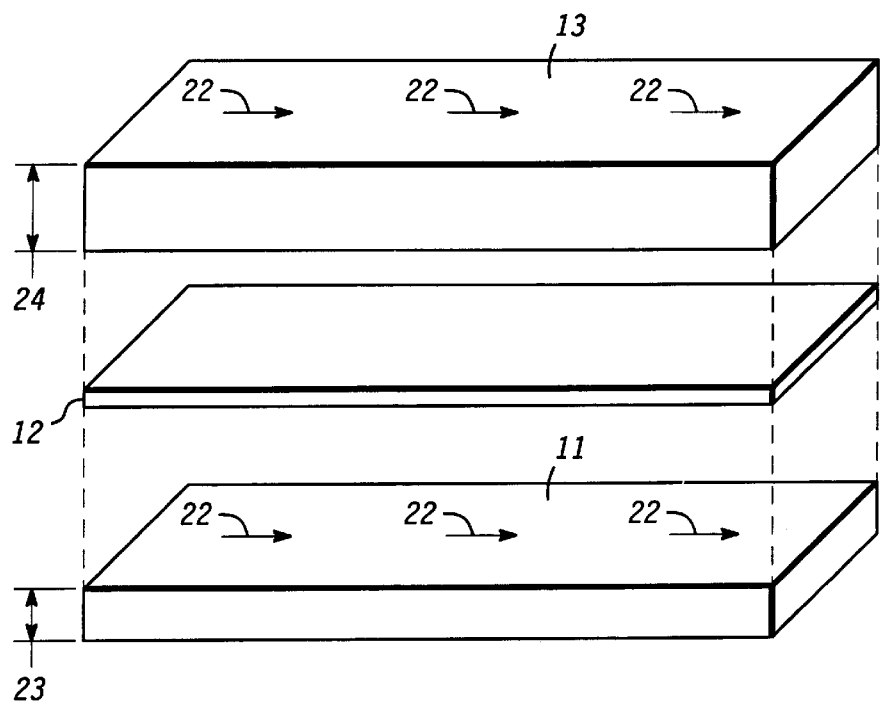
FIG. 3 illustrates another enlarged exploded view of the GMR material shown in FIG. 1 according to the present invention.

FIG. 2 and FIG. 3 illustrate enlarged exploded views of material 10 shown in FIG. 1. Portions of FIG. 2 and FIG. 3 that have the same reference numbers as FIG. 1 are the same as the corresponding FIG. 1 elements. In the preferred embodiment, layers 11 and 13 are rectangular and are formed with the easy axis of magnetization along a length 27 and not along a width 26. In other embodiments, the easy axis can be along width 26. Layers 11 and 13 each have magnetization vectors 21 and 22 that are substantially along length 27, that is, substantially parallel to length 27. Layers 11 and 13 are coupled by a ferromagnetic coupling which allows vectors 21 and 22 to align in the same direction in the absence of an external magnetic field. This coupling is a function of the material and the thickness of layer 12.

Additionally width 26 is formed to be smaller than the width of the magnetic domain walls or transition width within layers 11 and 13. Consequently, vectors 21 and 22 can not be parallel to width 26. Typically, widths of less than 1.0 to 1.2 microns result in such a constraint. In the preferred embodiment, width 26 is less than one micron and is as small as can be made by manufacturing technology, and length 27 is approximately five times width 26. The greater the value of length 27 the higher the output voltage of material 10. Also in the preferred embodiment, thickness 23 is approximately three to six nanometers and thickness 24 is approximately four to ten nanometers. As will be seen hereinafter, the difference in thickness 23 and 24 affect the switching points of layers 11 and 13. In the preferred embodiment, layers 11 and 13 each are two layer structures including layers of cobalt-iron and nickel-iron-cobalt so that cobalt-iron is at the interface with conductive layers.

Vectors 21 and 22 illustrate two different states of magnetization vectors within material 10. One state is referred to as a logic "0" and the other state is logic "1". For each state all vectors in both layers 11 and 13 point in a first direction, and for the other state all vectors in both layers 11 and 13 point in the opposite or second direction.

Because thickness 24 is greater than thickness 23, material 10 has a magnetoresistive characteristic curve that has a wide operating area. The resistance can be determined by sensing a voltage output of material 10. The voltage output is the voltage drop across the length of material 10 with a constant current applied along the length of material 10 and while a magnetic field is applied. One method of determining the state of material 10 is to apply a total magnetic field that is not sufficient to switch the magnetic vectors of either layers 11 or 13. When the total magnetic field is in a direction that supports the magnetic vectors, that is, in the same direction along length 27 as the magnetization vectors, the magnetic vectors do not substantially rotate so the resistance of material 10 does not substantially change. Correspondingly, the output voltage also does not substantially change.

However, when the total magnetic field opposes the vectors, the magnetic vectors rotate. As the field increases the vectors of layer 11 begin to rotate toward the opposite end of layer 11 (the vectors of layer 13 may rotate slightly). As the field increases further, the vectors of layer 11 continue to rotate and the resistance increases until the vectors snap to the opposite direction. For further increases, the resistance remains substantially constant until the vectors of layer 13 also snap. Thereafter, the resistance decreases as the field increases.

To write or change the state of material 10, a total magnetic field is applied that is sufficient to completely switch the direction of the magnetic vectors of both layers 11 and 13 from along one direction of length 27 to along the opposite direction of length. That is, switch from the state of vectors 21 to that of vectors 22 or vice versa.

Figure 4:
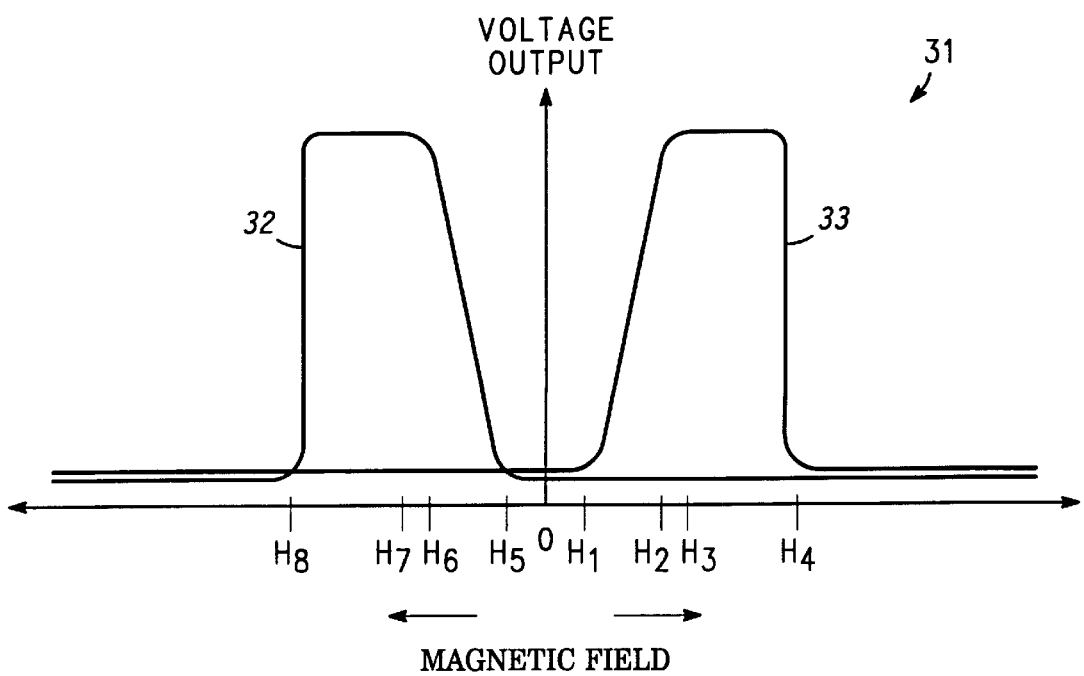
FIG. 4 is a graph illustrating characteristics of the GMR material shown in FIG. 1 according to the present invention.

FIG. 4 is a graph 31 illustrating the resistance or voltage output of material 10 (FIG. 1) verses the applied magnetic field or total magnetic field. The abscissa indicates magnetic field direction and strength, that is , the strength either supports or opposes the magnetic vectors of material 10. The ordinate represents the voltage output of material 10. A curve 32 indicates the magnetoresistance characteristic, via the output voltage, for various magnetic field intensities for one direction of magnetization vectors. A curve 33 indicates the magnetoresistance characteristic, via the output voltage, for the same magnetic field intensities for the opposite direction of magnetization vectors. To the right of zero, curves 32 and 33 indicated the output voltage for magnetic fields that support the vectors of curve 32 and oppose the vectors of curve 33, and magnetic fields to the left of zero support the vectors of curve 33 and oppose the vectors of curve 32. Typically, curves 32 and 33 cross the voltage axis at the same point and have the same minimum values. For the sake of explanation, curve 33 is shifted vertically a slight amount to show the differences between the curves.

At zero applied field, the voltage output of material 10 is approximately the same regardless of the magnetization vector direction. As the field increases from zero to $H_1$, curve 33 shows the voltage output of material 10 having vectors that are opposed by the total magnetic field, and curve 32 shows the voltage of material 10 having vectors that are supported the magnetic field. At magnetic field intensity of $H_1$, the vectors of the layer 11 begin to rotate and increase the output voltage. As the total magnetic field intensity increases between $H_1$ and $H_3$, the magnetic vectors of layer 11 continue to rotate and snap to the other direction near a field intensity of $H_3$. Near $H_4$, the vectors of thicker layer 13 snap to the opposite direction and the resistance decreases for values of $H_4$ and above. Similarly, the output voltage for an opposite direction total magnetic field is shown between zero and $H_5$ to $H_8$.

Because layers 11 and 13 (FIG. 1) have different thicknesses, the magnetic vectors rotate at different intensities of the total magnetic field. This characteristic results in curves 32 and 33 having a wide operating range. That is, the applied magnetic field can vary from $H_2$ to $H_4$ or from $H_6$ to $H_8$ without a substantial change in the output voltage. This allows the total magnetic field to vary or drift and relaxes the need to have stringent controls on the magnetic field intensity thereby reducing the circuitry needed to control the magnetic field and reducing the costs of memories and another apparatus using material 10.

Using the magnetoresistive characteristics of material 10, a single magnetic field direction and intensity can be applied to determine the state or output voltage of material 10 (FIG. 1). A magnetic field can be applied with a direction and a value of approximately $H_2$, or between $H_3$ and $H_4$. If a high output voltage is detected, material 10 is magnetized in a first state or "0" state, and if a low voltage output is detected, material 10 is in a second state or "1" state. Alternately, a magnetic field can be applied in an opposite direction with an equivalent value so that material 10 is operating near point $H_6$ or between points $H_7$ and $H_8$. If a high output voltage is detected, material 10 is in the "1"state, and if a low voltage is detected material 10 is magnetized in the "0" state.

Figure 5:
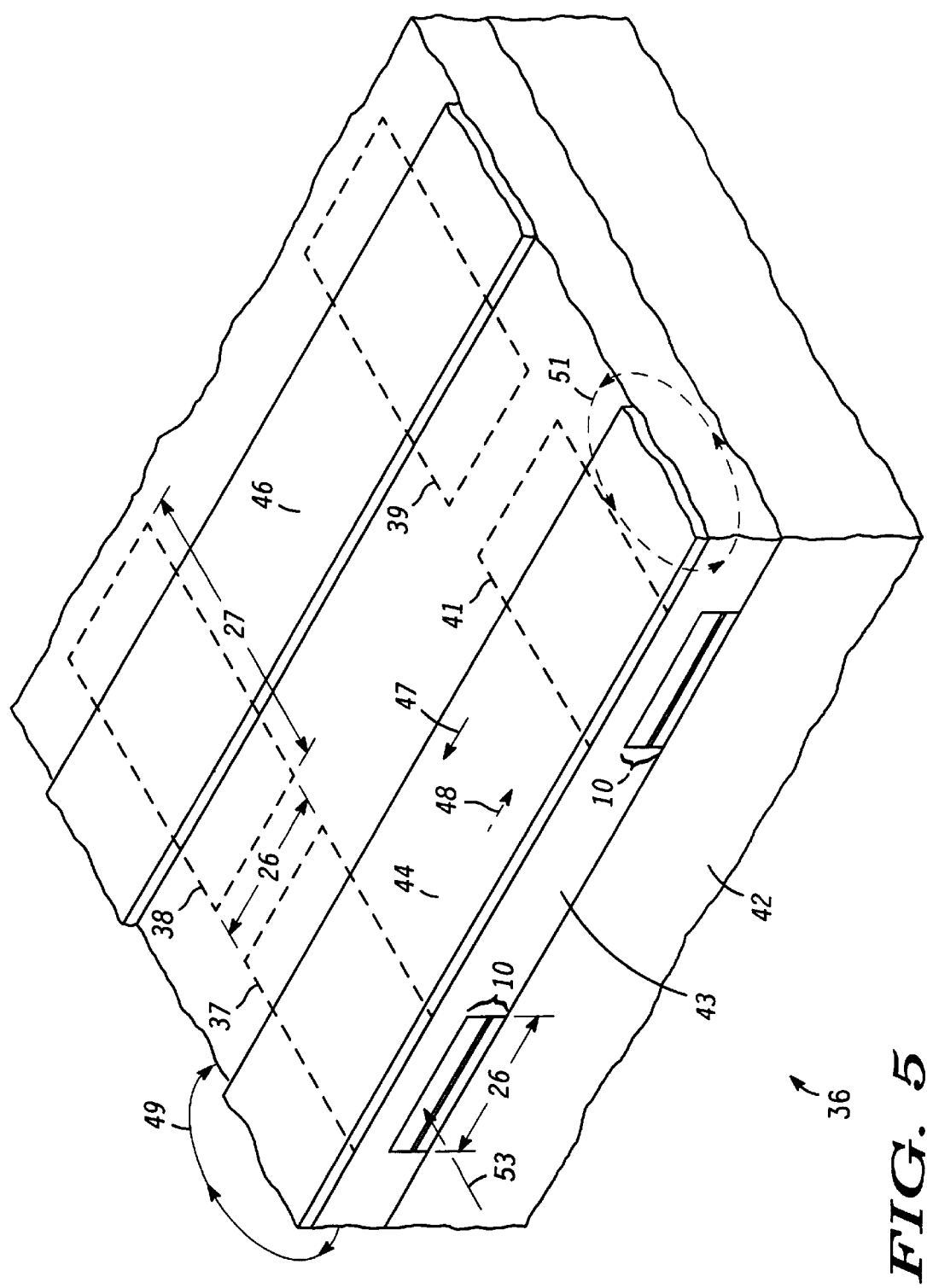
FIG. 5 illustrates an enlarged perspective view of a portion of a memory utilizing the GMR material shown in FIG. 1 according to the present invention.

FIG. 5 illustrates an enlarged perspective view of a portion of a memory array or memory 36 that uses material 10 (FIG. 1) for each individual memory cell of memory 36. Elements of FIG. 5 that have the same reference numbers as FIG. 1 are the same as the corresponding FIG. 1 elements. Memory 36 includes a plurality of memory cells including a first cell 37, a second cell 38, a third cell 39, and a fourth cell 41, indicated by dashed boxes. Memory 36 also includes a substrate 42, for example a semiconductor substrate, onto which a plurality of material 10 (FIG. 1) elements or magnetic materials are formed representing cells 37, 38, 39, and 41,. Substrate 42 can also include other circuitry including sense amplifiers and digital circuitry.

A dielectric 43 is applied to cover the exposed portions of substrate 42 and each material 10 that is formed on substrate 42. Typically, material 10 elements are formed on substrate 42 with a space between each individual material 10 element. A conductor is then applied to interconnect material 10 elements in individual rows. For example, a conductor is applied between cells 37 and 38 to form a first row or sense line, and another conductor is applied between cells 41 and 39 in order to form a second row or sense line. A plurality of transverse conductors or word lines are applied on the surface of dielectric 43 overlying the memory cells. A first conductor or first word line 44 overlays material 10 of cells 37 and 41, and a second conductor or second word line 46 overlays material 10 of cells 38 and 39.

In order to read the status of cells 37, 38, 39, or 41, a word current is applied to a word line and a voltage is sensed from a sense line. For example, a first word current 47 can be applied to line 44 for applying a first total magnetic field 49 with a first direction to cell 37. The magnitude of field 49 is not sufficient to switch the state of cell 37. Typically the field is between point $H_1$ and $H_3$ of FIG. 4. The voltage of the sense line that includes cell 37 can then be determined by the magnitude of the voltage as indicated in the description of points $H_2$ or $H_6$ in FIG. 4. For example, the sense line can be connected to an input of a sense amplifier, not shown, to determine the voltage output of cell 37. Because it is only necessary to apply a word current and sense the voltage output, the time required to determine the state of cell 37 is reduced. Because only a single read operation is required, the electronics utilized to determine the state of cell 37 is also reduced. Also, no reference cell is required nor is it necessary to use transistors in each memory cell to connect and disconnect the memory cells from the sense line.

Alternately, a comparison operation can be performed between two voltage values in order to read the state of the memory. A first voltage output can be determined or sensed by applying word current 47 and sense current 53. This first voltage output is stored. The total magnetic field is not sufficient to switch either layer 11 or 13. Then, a second voltage output is determined or sensed by applying a second word current that is in opposite direction to the first word current. For example a second word current 48, illustrated by a dashed arrow, establishes a magnetic field 51, illustrated by a dashed circle, that is in the opposite direction to field 49. Sense current 53 is once again applied and the voltage output determined. If cell 37 were in a "0" state, the first voltage would be a large voltage and the second voltage would be a small voltage, and if cell 37 were in a "1" state, the reverse is true. This is because of the magnetoresistive characteristics as indicated in the description of FIG. 4.

Also, if the magnitude of the voltage output is small, a partial-switch read operation can be performed. Because layer 11 is thinner than layer 13, the magnetic field intensity required to completely switch the state of the magnetic vectors of layer 11 is less than the magnetic field intensity required to completely switch the state of the magnetic vectors of layer 13. This can be utilized to sense the state of a memory cell. Currents 53 and 47 are applied at a value that is great enough to completely switch the state of the magnetic vectors in layer 11 of material 10 (FIG. 1) but not switch the state the magnetic vectors of layer 13. If the total magnetic field supports the magnetic vectors of cell 37, the magnetic vectors of layers 11 and 13 do not substantially rotate and the output voltage is low. If the total magnetic field opposes the magnetic vectors of cell 37, the magnetic vectors of layer 13 may rotate toward the opposite direction but the magnetic vectors of layer 11 completely switch thereby increasing the value of the output voltage. After the read is complete, another total magnetic field that is opposite to the prior magnetic field is applied by current 48 to restore the magnetic vectors of layer 11 to the original state. The magnitude typically is at least the magnitude of the prior magnetic field.

It should be noted that in some cases, an additional digit line that is perpendicular to the word lines is required to ensure the value of the total magnetic field is sufficient to cause the magnetic vectors to either rotate or to switch. The value of the total magnetic field is a summation of the magnetic fields resulting from the sense, word, and digit line currents.

By now it should be appreciated that there has been provided a novel GMR material and a novel method of using the GMR material. Forming the width of the material to be less than the magnetic domain wall size ensures that the magnetic vectors are not perpendicular to the length of the material. Forming the material to have magnetic layers that have alternating thicknesses results in a novel wide operating magnetoresistive characteristics that reduces the cost of apparatus such as memories that use material 10. The novel wide operating magnetoresistive characteristic also facilitates utilizing a single read operation to determine the state of memory arrays using the novel GMR material. Forming a memory array with material 10 results in a high density array because of the submicron in width, and because reference cells are not required. The single read operations minimize the amount of external circuitry utilized to determine the state of each cell of the memory array thereby increasing the density and reducing the cost of a memory that utilizes the material.

What is claimed is:

1. A method of forming a GMR material comprising:

forming a plurality of magnetic material layers with each magnetic material layer having a width that is less than a width of a magnetic domain wall within the magnetic material layer wherein each magnetic material layer is ferromagnetically coupled to adjacent magnetic material layers, wherein magnetic vectors in each magnetic material layer point substantially along a length of the GMR material, and wherein the magnetization vector of each magnetic material layer rotates at different intensities of a magnetic field applied to the GMR material.

2. A ferromagnetically coupled magnetic memory comprising:

first and second layers of a ferromagnetically coupled GMR material, each of the first and second layers having different thicknesses and a magnetization vector which rotates at different intensities of a magnetic field applied to the GMR material;

an insulator overlying the first layer of the ferromagnetically coupled GMR material; and a first conductor layer overlying the insulator wherein the first conductor is substantially perpendicular to the layer of the ferromagnetically coupled GMR material.

3. The memory of claim 2 further including a dielectric overlying the first conductive layer; and a second conductor spaced apart from the first conductive layer and the first and second layers wherein the second conductor is substantially perpendicular to the first conductor layer.

4. A method of using a ferromagnetically coupled magnetic memory cell including first and second magnetoresistive materials having different thicknesses, and a word line spaced apart from the first magnetoresistive material, comprising:

applying a positive sense current to the first and second magnetoresistive material and a first word current to the word line for applying a first total magnetic field to a memory cell in a first direction and with a first magnitude that is not sufficient to switch a state of the memory, cell;

determining a first voltage output of the memory cell;

changing the first word current to a second word current;

applying the second word current to the word line for applying a second total magnetic field to the memory cell in a second direction and with a second magnitude that is not sufficient to switch the state of the memory cell;

determining a second voltage output of the memory cell; and comparing the first voltage output to the second voltage output.

5. A method of using a ferromagnetically coupled magnetic memory cell including a word line spaced apart from first and second magnetoresistive materials, comprising:

applying a first word current to the word line for applying a first total magnetic field to the memory cell in a first direction and with a first magnitude that sets the direction of a magnetic vector in the first magnetic material but does not set the direction of the magnetic vector in the second magnetic material; and determining a first voltage output of the memory cell.

6. The method of claim 5 further including applying a second word current to the word line for applying a second total magnetic field to the memory cell in a second direction that reverses the direction of the magnetic vector in the first magnetic material without reversing the direction of the magnetic vector in the second magnetic material.

7. A method of using a ferromagnetically coupled magnetic memory cell including two ferromagnetic layers, comprising:

applying a first total magnetic field to the memory cell in a first direction and with a first magnitude that is sufficient to switch the state of magnetic vectors in only one ferromagnetic layer of the memory cell; and determining a first voltage output of the memory cell.

8. The method of claim 7 further including applying a second total magnetic field to the memory cell in a second direction opposite the first direction and with a second magnitude that is at least equal to the first magnitude.

9. A method of using a ferromagnetically coupled magnetic memory cell including a word line spaced apart from first and second magnetoresistive materials, comprising:

applying a word current to the word line for applying a first total magnetic field to the memory cell in a first direction that sets the direction of magnetic vectors in the first and second magnetic material.

* * * * *